United States Patent
Kim et al.

(10) Patent No.: US 11,081,645 B2
(45) Date of Patent: Aug. 3, 2021

(54) MASK ASSEMBLY WITH SURFACE ROUGHENED MASK SHEET AT WELDING LOCATION, METHOD OF MANUFACTURING THE SAME, AND METHOD OF MANUFACTURING DISPLAY DEVICE USING THE SAME

(71) Applicant: Samsung Display Co., Ltd., Yongin-Si (KR)

(72) Inventors: In-Bae Kim, Daejeon (KR); Minho Moon, Anyang-si (KR); Youngho Park, Suwon-si (KR); Sungsoon Im, Suwon-si (KR)

(73) Assignee: Samsung Display Co., Ltd.

( * ) Notice: Subject to any disclaimer, the term of this patent is extended or adjusted under 35 U.S.C. 154(b) by 62 days.

(21) Appl. No.: 16/563,619

(22) Filed: Sep. 6, 2019

(65) Prior Publication Data

US 2020/0152876 A1 May 14, 2020

(30) Foreign Application Priority Data

Nov. 8, 2018 (KR) .......................... 10-2018-0136310

(51) Int. Cl.

| H01L 51/00 | (2006.01) |
| H01L 27/32 | (2006.01) |
| H01L 51/56 | (2006.01) |
| C23C 14/04 | (2006.01) |
| B23K 26/22 | (2006.01) |
| B23K 26/352 | (2014.01) |
| C23C 14/24 | (2006.01) |

(52) U.S. Cl.
CPC .......... *H01L 51/0011* (2013.01); *B23K 26/22* (2013.01); *B23K 26/3568* (2018.08); *C23C 14/042* (2013.01); *C23C 14/24* (2013.01); *H01L 27/3244* (2013.01); *H01L 51/001* (2013.01); *H01L 51/56* (2013.01); *H01L 2227/323* (2013.01)

(58) Field of Classification Search
CPC ............. H01L 51/0011; H01L 27/3244; H01L 51/001; H01L 51/56; H01L 2227/323; C23C 14/042; C23C 14/24; C23C 14/22; C23C 14/12; B23K 26/22; B23K 26/3568; B23K 26/355; B23K 26/60
See application file for complete search history.

(56) References Cited

U.S. PATENT DOCUMENTS

| 2002/0025406 A1* | 2/2002 | Kitazume ................. B32B 3/10 428/136 |
| 2017/0198383 A1* | 7/2017 | Chang ................. B23K 26/0661 |
| 2020/0407836 A1* | 12/2020 | Luo ........................ C23C 14/042 |

FOREIGN PATENT DOCUMENTS

| KR | 10-2017-0084738 A | 7/2017 |
| KR | 10-2018-0080582 A | 7/2018 |

* cited by examiner

*Primary Examiner* — John P. Dulka
(74) *Attorney, Agent, or Firm* — Innovation Counsel LLP

(57) ABSTRACT

Provided is a mask assembly including a mask sheet including a pattern part with at least one opening part, and a welding part connected to the pattern part, and a mask frame with the mask sheet mounted thereon and welded to the welding part. The mask sheet includes a first surface configured to fact the mask frame and a second surface opposite to the first surface. The welding part includes a hatching area in which a surface roughness of the second surface is larger than that of the second surface in the pattern part.

18 Claims, 14 Drawing Sheets

MASK ASSEMBLY WITH SURFACE ROUGHENED MASK SHEET AT WELDING LOCATION, METHOD OF MANUFACTURING THE SAME, AND METHOD OF MANUFACTURING DISPLAY DEVICE USING THE SAME

CROSS-REFERENCE TO RELATED APPLICATIONS

This U.S. non-provisional patent application claims priority under 35 U.S.C. § 119 of Korean Patent Application No. 10-2018-0136310, filed on Nov. 8, 2018, the entire contents of which are hereby incorporated by reference.

BACKGROUND

The present disclosure herein relates to a mask assembly, a method of manufacturing the same, and a method of manufacturing an organic light emitting display apparatus using the same.

Various methods for providing a thin film of an organic compound in an organic light emitting display apparatus include vacuum deposition, sputtering, ion-beam deposition, pulsed-laser deposition, molecular beam deposition, chemical vapor deposition (CVD), spin coating, and the like.

Among them, the vacuum deposition technique, which is most typically used, is a method of combining a deposition source and a film forming substrate in a vacuum chamber to provide a thin film. This is a representative method for providing a light emission layer of an organic electric-field light-emitting element. However, a mask used in such a deposition process is manufactured in an etching manner, and thus the manufacturing range becomes limited.

In order to manufacture a mask that produces a high resolution product, an electroplating manner is used. An electroplating mask may realize a high resolution product, and thus is widely used for providing a light emission layer of an organic electric-field light-emitting element.

SUMMARY

The present disclosure provides a mask assembly of which welding characteristics are improved, a method of manufacturing the same, and a method of manufacturing an organic light emitting display apparatus using the same.

An embodiment of the inventive concept provides a mask assembly including: a mask sheet and a mask frame. The mask sheet includes a pattern part with at least one opening part, and a welding part connected to the pattern part. The mask sheet is mounted on the mask frame, and the mask frame is welded to the welding part of the mask sheet.

In an embodiment, the mask sheet may include a first surface facing the mask frame and a second surface opposite to the first surface, and the welding part may include a hatching area. A surface roughness of the second surface in the hatching area may be larger than that of the second surface in the pattern part.

In an embodiment, an arithmetical average roughness of the second surface in the hatching area may be larger than that of the second surface in the pattern part.

In an embodiment, the arithmetical average roughness of the second surface in the hatching area may be about 0.1 μm to about 0.2 μm, and the arithmetical average roughness of the second surface in the pattern part may be about 0 μm to about 0.05 μm.

In an embodiment, a ten-point roughness of the second surface in the hatching area may be larger than that of the second surface in the pattern part.

In an embodiment, the ten-point average roughness of the second surface in the hatching area may be about 2.0 μm to about 5.0 μm, and the ten-point average roughness of the second surface in the pattern part may be about 0 μm to about 0.5 μm.

In an embodiment, the mask sheet may have the thickness of about 20 μm to about 50 μm.

In an embodiment, the welding part may further include a welding spot fixed to the mask frame, and the welding spot may be provided in the hatching area.

In an embodiment, the welding spot may have a smaller width than the hatching area.

In an embodiment, the particle size of the mask sheet in the hatching area may be larger than that of the mask sheet in the pattern part.

In an embodiment of the inventive concept, a method of manufacturing a mask assembly includes: providing a base sheet including a provisional pattern part and a provisional welding part; providing a machining pattern to the provisional pattern part at a first surface position of the base sheet; inverting the base sheet; performing a hatching process for providing a hatching area in the provisional welding part on a second surface of the base sheet opposite to the first surface to complete a mask sheet; and performing a welding process for irradiating the hatching area with a welding laser to fix the mask sheet to a mask frame. The hatching area has a higher surface roughness than the provisional pattern part.

In an embodiment, the performing the hatching process may be proceeded by irradiating the hatching area with a hatching laser.

In an embodiment, the hatching laser may have a green wavelength band.

In an embodiment, in the performing the welding process, a welding spot may be provided in the hatching area by the welding laser.

In an embodiment, the width of the hatching area may be equal to or larger than that of the welding spot.

In an embodiment, an arithmetical average roughness of the second surface in the hatching area may be larger than that of the second surface in the pattern part.

In an embodiment, the arithmetical average roughness of the second surface in the hatching area may be about 0.1 μm to about 0.2 μm, and the arithmetical average roughness of the second surface in the pattern part may be about 0 μm to about 0.05 μm.

In an embodiment, a ten-point average roughness of the second surface in the hatching area may be larger than that of the second surface in the pattern part.

In an embodiment, the ten-point average roughness of the second surface in the hatching area may be about 2.0 μm to about 5.0 μm, and the ten-point average roughness of the second surface in the pattern part may be about 0 μm to about 0.5 μm.

In an embodiment, the mask sheet may have a nickel content of about 30 wt % to about 50 wt %.

In an embodiment of the inventive concept, a method of manufacturing an organic light emitting display device, which includes a pixel including an organic light emitting element and a pixel driving circuit configured to drive the organic light emitting element, includes: providing the pixel driving circuit on a base layer; and providing the organic light emitting element on the pixel driving circuit. The providing of the organic light emitting element includes: providing a first electrode; providing a light emission layer on the first electrode using a mask assembly; and providing a second electrode configured to face the first electrode on the light emission layer.

Here, the mask assembly may include a mask sheet and a mask frame. The mask sheet includes a pattern part with at least one opening part, and a welding part connected to the pattern part. The mask sheet is mounted on the mask frame. The mask frame is welded to the welding part of the mask sheet. The mask sheet may include a first surface facing the mask frame and a second surface opposite to the first surface, and the welding part may include a hatching area. A surface roughness of the second surface in the hatching area may be larger than that of a second surface in the pattern part.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1:
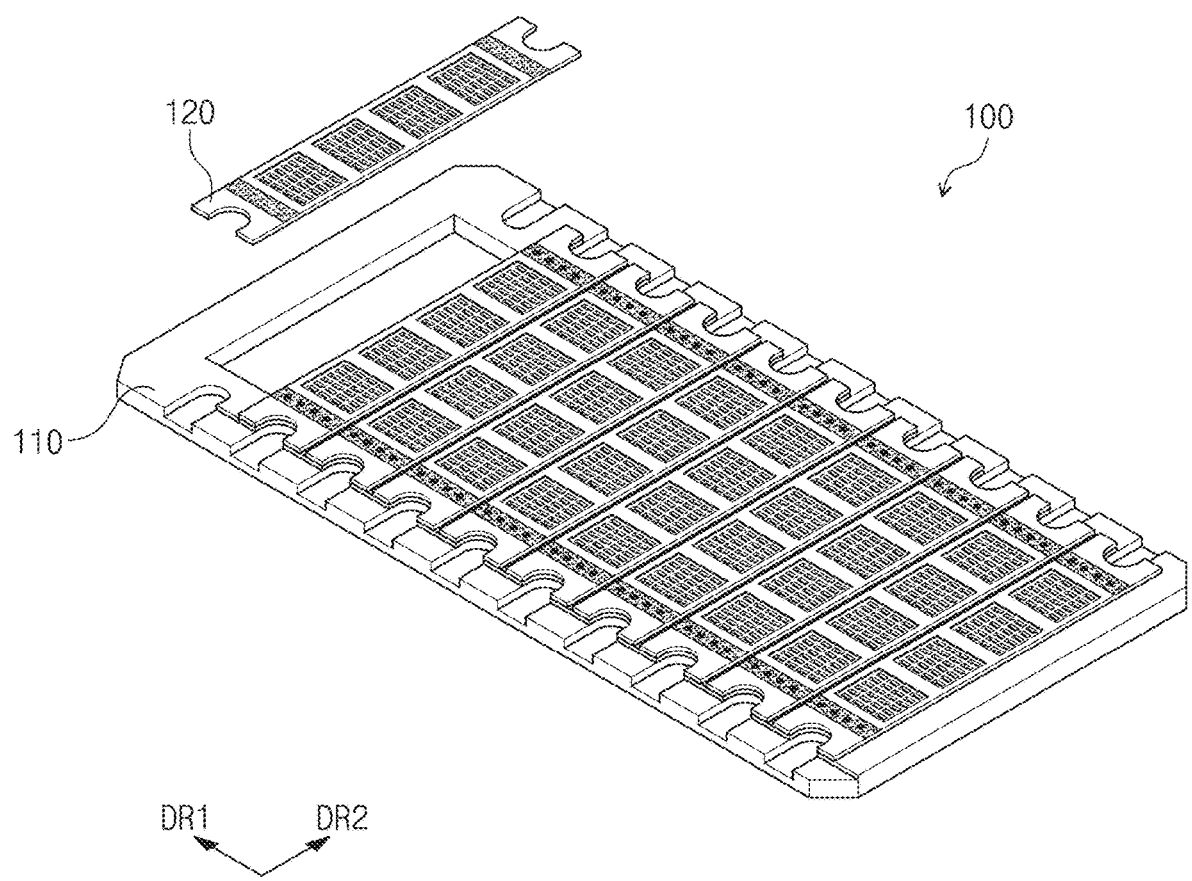
FIG. 1 is a perspective view illustrating a mask assembly according to an embodiment of the inventive concept.

It will be understood that when an element or layer is referred to as being "on", "connected to" or "coupled to" another element or layer, it can be directly on, connected or coupled to the other element or intervening third elements may be present.

Like reference numerals in the drawings refer to like elements. In addition, in the drawings, the thickness and the ratio and the dimension of the element are exaggerated for effective description of the technical contents.

The term "and/or" includes any and all combinations of one or more of the associated items.

Terms such as first, second, and the like may be used to describe various components, but these components should not be limited by the terms. The terms are used only for the purpose of distinguishing one component from another component. For instance, a first component may be referred to as a second component, or similarly, a second component may be referred to as a first component, without departing from the scope of the present invention. The singular forms "a," "an" and "the" are intended to include the plural forms as well, unless the context clearly indicates otherwise.

In addition, the terms such as "under", "lower", "on", and "upper" are used for explaining associations of items illustrated in the drawings. It will be understood that the spatially relative terms are intended to encompass different orientations of the device in use or operation in addition to the orientation depicted in the figures.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

It will be further understood that the terms "includes" and/or "including", when used in this specification, specify the presence of stated features, integers, steps, operations, elements, components or combinations thereof, but do not preclude the presence or addition of one or more other features, integers, steps, operations, elements, components, or combinations thereof.

Hereinafter, embodiments of the inventive concept will be described with reference to the accompanying drawings.

Figure 2:
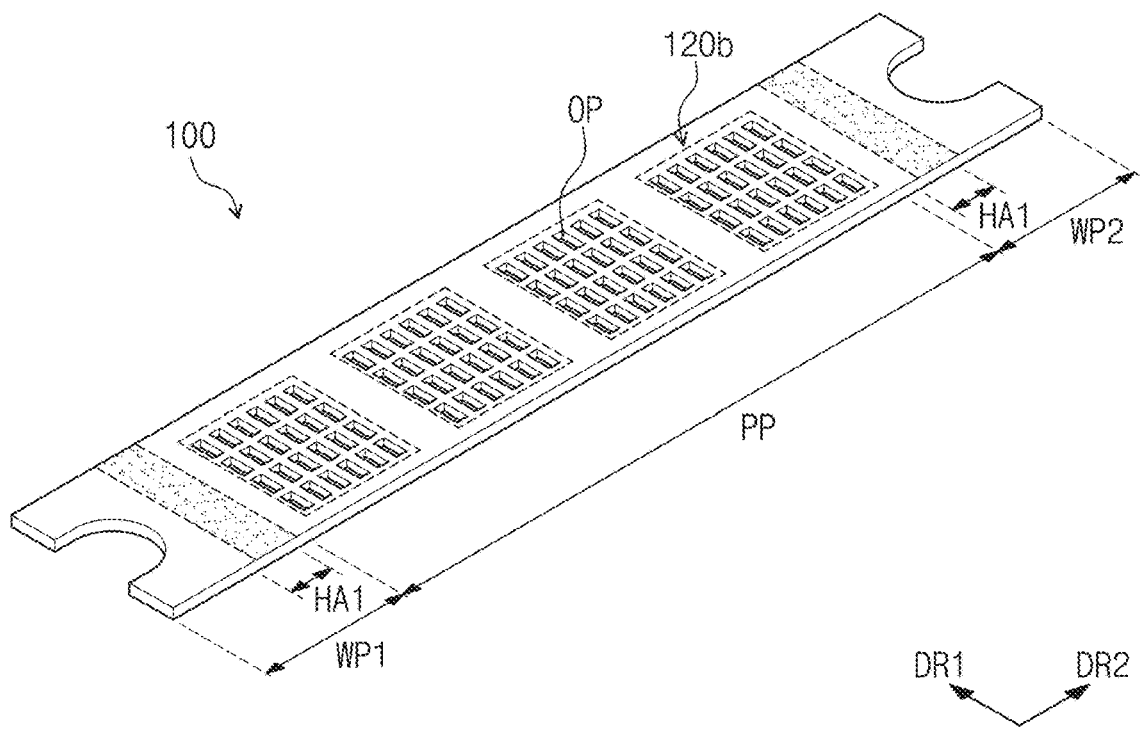
FIG. 2 is a perspective view of a mask sheet illustrated in FIG. 1.
Figure 3:
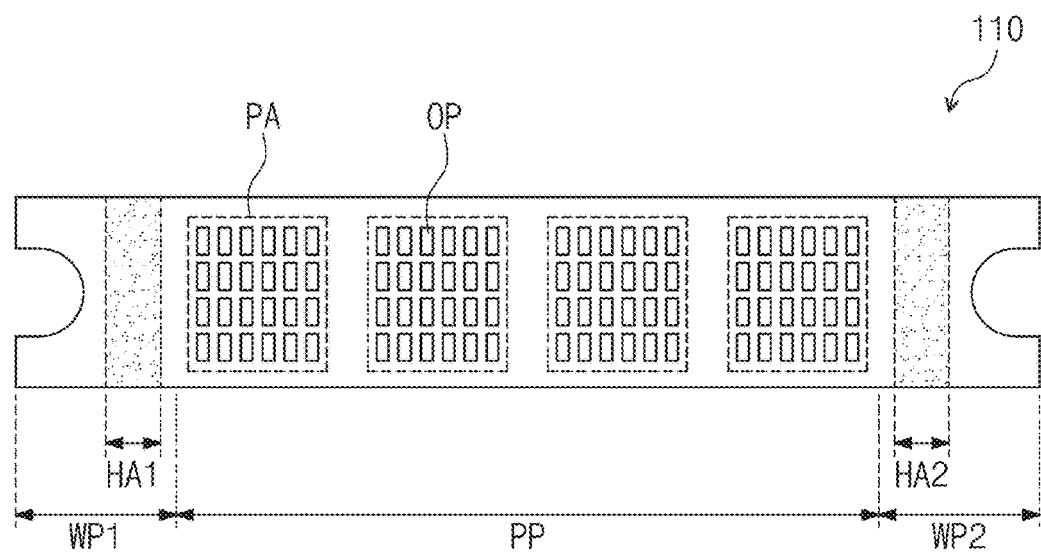
FIG. 3 is a plan view of the mask sheet illustrated in FIG. 2.

FIG. 1 is a perspective view illustrating a mask assembly according to an embodiment of the inventive concept, FIG. 2 is a perspective view of a mask sheet illustrated in FIG. 1, and FIG. 3 is a plan view of the mask sheet illustrated in FIG. 2.

Referring to FIGS. 1 and 2, the mask assembly 100 may include a mask frame 110 and one or more mask sheets 120 mounted on the mask frames 110.

The mask frame 110 may be provided in a frame type of which a center part is open. In FIG. 1, a structure in which the mask frame 110 is provided with one frame is illustrated. However, the inventive concept is not limited thereto, and when the size of the mask assembly 100 increases, the mask frame 110 may be provided with a plurality of frames. Here, the plurality of frames may be connected to each other to provide one mask frame.

The mask sheet 120 may be installed on the mask frame 110. As an example of the inventive concept, a structure in which a plurality of mask sheets are installed on the mask frame 110 is illustrated. The number of the mask sheets 120, which are provided in the mask assembly 100, is not particularly limited.

The mask sheets 120 may be attached to the mask frame 110 through welding. The plurality of mask sheets 120 may be arrayed to be adjacent to each other along one side direction (hereinafter, a first direction DR1) of the mask frame 110. Here, the plurality of mask sheets 120 may shield the opening center part of the mask frame 110.

Each of the mask sheets 120 may have a structure extended lengthwise along one direction. When the mask sheets 120 are arrayed in the first direction DR1, a length direction of each of the mask sheets 120 may be parallel to a second direction DR2 that is perpendicular to the first direction DR1.

Each of the mask sheets 120 may be provided with a material of a nickel-iron alloy. Here, the content of nickel may be about 30 wt % to about 50 wt % of the total weight of each of the mask sheets 120.

In relation to FIGS. 1 to 3, each of the mask sheets 120 may include a pattern part PP and a welding part connected to the pattern part PP. The pattern part PP may include one or more pattern areas PA. As an example of the inventive concept, the structure in which the pattern part PP includes 4 pattern areas PA is illustrated, but the number of the pattern areas PA is not limited thereto. The pattern areas PA may be arrayed at a constant interval in the second direction DR2. Each of the pattern areas PA may correspond to a process area of a target substrate on which a deposition material is to be deposited.

A plurality of opening parts OP may be provided in each of the pattern areas PA. The plurality of opening parts OP may be disposed to be separated by a constant interval and provide a certain pattern.

The welding part WP1 and WP2 may include a first welding part WP1 connected to one end of the pattern part PP and a second welding part WP2 connected to a second end of the pattern part PP. The first and second welding parts WP1 and WP2 may be parts mounted on the mask frame 110.

Each of the mask sheets 120 may include a first surface 120a configured to face the mask frame 110, and a second surface 120b opposite to the first surface 120a. Here, the first surface 120a is defined as a lower surface of each mask sheet 120, and the second surface 120b is defined as an upper surface of the each mask sheet 120.

The welding part WP1 and WP2 may include a hatching area. The first welding part WP1 includes a first hatching area HA1 and the second welding part WP2 includes a second hatching area HA2. The width of each hatching area HA1 or HA2 may be smaller than that of the corresponding welding part WP1 or WP2. Here, the width of each of the first and second hatching area HA1 and HA2 and the width of each of the first and second welding part WP1 and WP2 indicate widths in the second direction DR2.

The surface roughness of the second surface 120b corresponding to the first and second hatching areas HA1 and HA2 is larger than that of the second surface 120b corresponding to the pattern part PP. In other words, the second surface 120b has a larger surface roughness in the first and second hatching areas HA1 and HA2 than in the pattern part PP.

Figure 4:
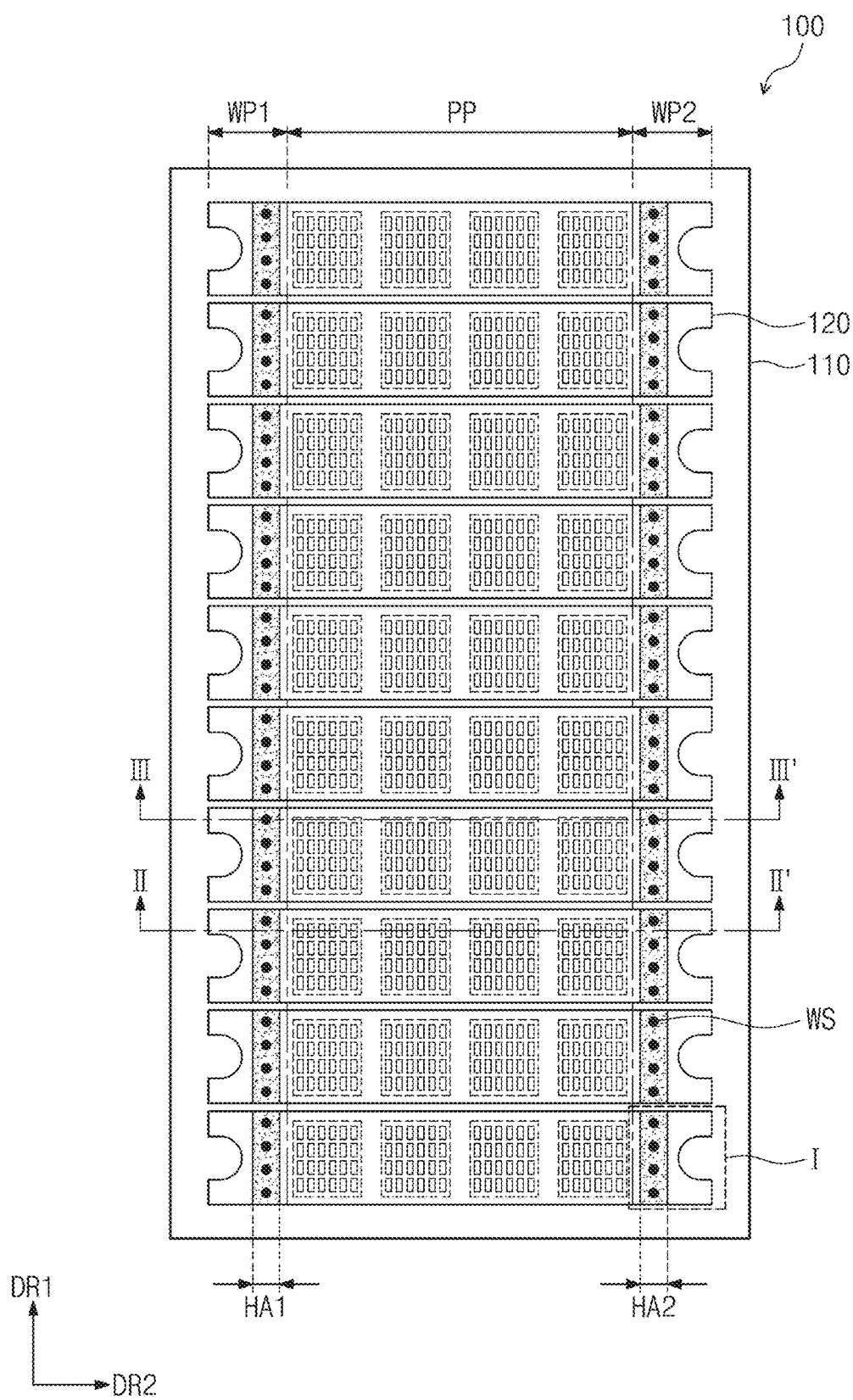
FIG. 4 is a plan view of the mask assembly illustrated in FIG. 1.
Figure 5:
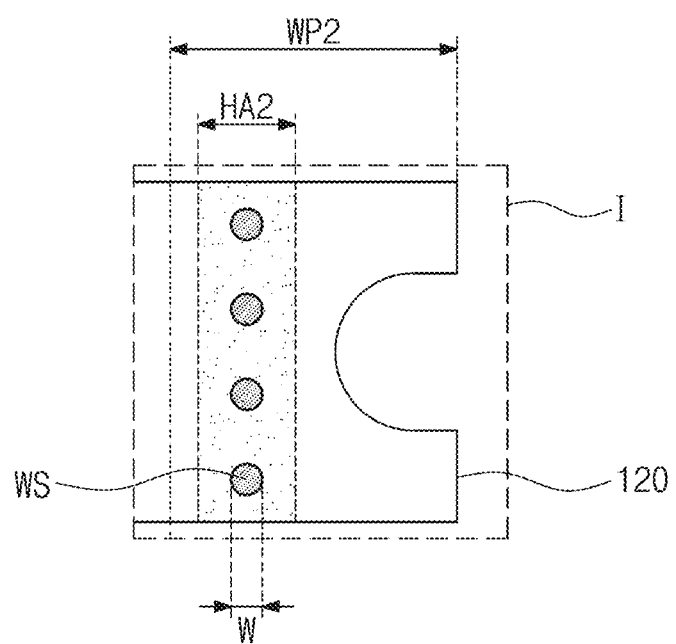
FIG. 5 is an enlarged view of an I part illustrated in FIG. 4.
Figure 6A:
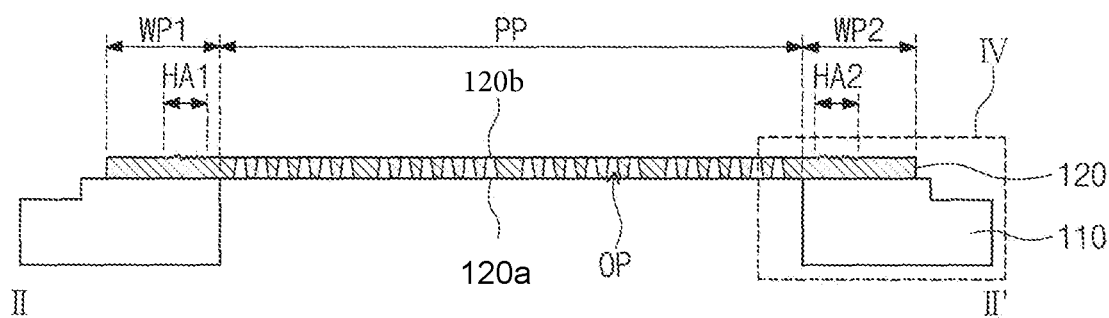
FIG. 6A is a cross-sectional view cut along II-IP illustrated in FIG. 4.
Figure 6B:
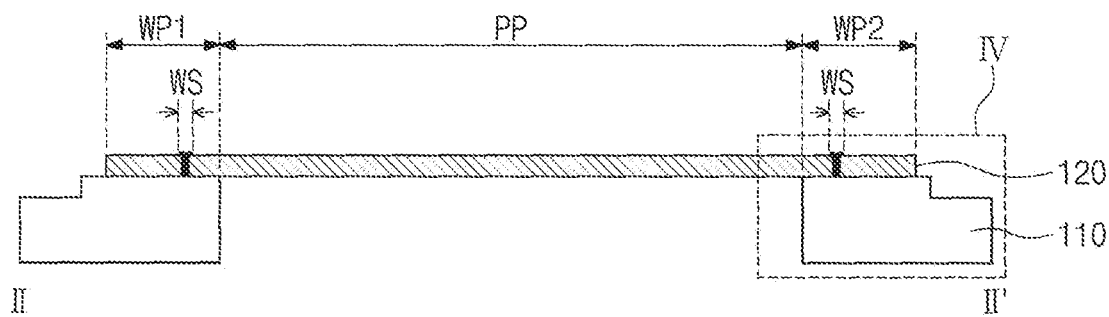
FIG. 6B is a cross-sectional view cut along III-III' illustrated in FIG. 4.
Figure 7:
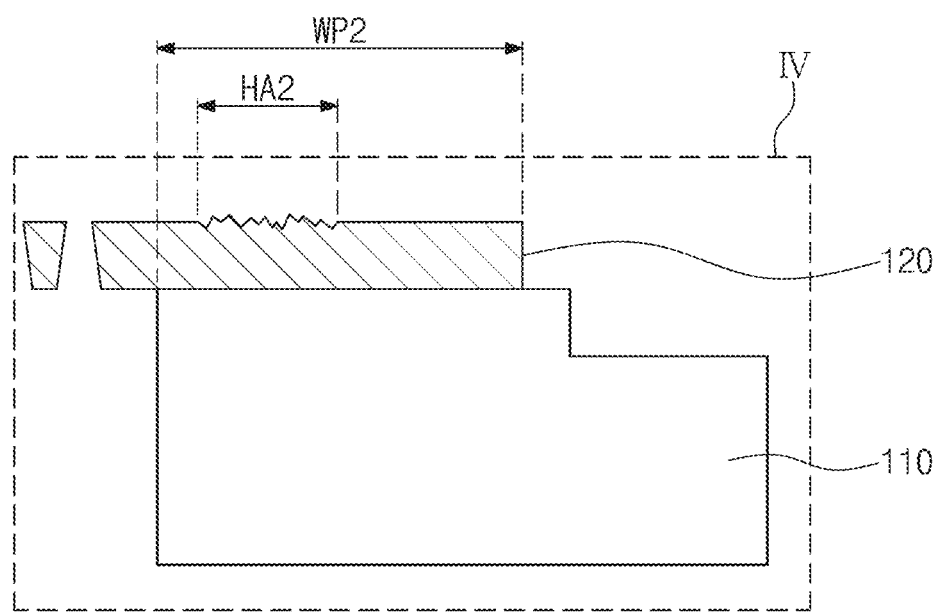
FIG. 7 is an enlarged cross-sectional view of a IV part of FIG. 6A.

FIG. 4 is a plan view of the mask assembly illustrated in FIG. 1, FIG. 5 is an enlarged view of an I part illustrated in FIG. 4, FIG. 6A is a cross-sectional view cut along II-IF illustrated in FIG. 4, FIG. 6B is a cross-sectional view cut along III-III' illustrated in FIG. 4, and FIG. 7 is an enlarged cross-sectional view of a IV part of FIG. 6A.

Referring to FIGS. 4 and 5, the mask sheets 120 may be attached to the mask frame 110 through welding. Each of the mask sheets 120 includes the first and second welding parts WP1 and WP2 on which welding is performed, and a welding spot WS is provided at each of the first and second welding parts WP1 and WP2. A plurality of welding spots WS may be provided at each of the welding parts WP1 and WP2, and the plurality of welding spots WS may be disposed separately from each other. The number of welding spots WS provided to each of the welding parts WP1 and WP2 is not particularly limited. The plurality of welding spots WS may be arrayed at each of the first and second welding parts WP1 and WP2 in the first direction DR1. Each of the plurality of welding spots WS may be provided in a polygonal or a circular type. For example, the welding spots WS may be semicircles and/or arches.

As illustrated in FIG. 5, the second welding part WP2 includes the second hatching area HA2. The width of the second hatching area HA2 may be smaller than that of the second welding part WP2. Here, the width of the second hatching area HA2 and the width of the second welding part WP2 represent the widths in the second direction DR2.

The second welding part WP2 is provided with the plurality of welding spots WS so as to be arrayed in the first direction DR1. In particular, the plurality of welding spots WS are provided to the second hatching area HA2. The plurality of welding spots WS may be arrayed at a constant interval along the first direction DR1. FIGS. 4 and 5 illustrate the structure in which the welding spots WS are arrayed in a row, but the array structure of the welding spots WS is not limited thereto. The welding spots WS may be arrayed in two or three rows.

The width w of each of the welding spots WS may be smaller than the width of the second hatching area HA2. Here, the width w of each of the welding spots WS and the width of the second hatching area HA2 represents the width in the second direction DR2.

In reference to FIG. 6A, FIG. 6B and FIG. 7, the mask sheet 120 may be provided with a material of a nickel-iron alloy. A first surface 120a of the mask sheet 120 faces the mask frame 110. A plurality of opening parts OP opened and provided from the first surface 120a are provided to the pattern part PP. The second surface 120b of the mask sheet 120 is opposite to the first surface 120a. The second surface 120b has a first surface roughness in the first and second hatching areas HA1 and HA2, and has a second surface roughness smaller than the first surface roughness in the pattern part PP. As an example of the inventive concept, the second surface 120b may be irradiated with a laser in correspondence to the first and second hatching areas HA1 and HA2, and increase the surface roughness of the first and second hatching areas HA1 and HA2.

The welding spots WS are provided to each of the first and second welding parts WP1 and WP2. In particular, the welding spots WS may be provided in the first and second hatching areas HA1 and HA2. The size of each of the welding spots WS may be smaller than the widths of each of the first and second hatching areas HA1 and HA2.

The welding spot WS is an area in which the welding laser is provided, and the mask sheet 120 may be fixed to the mask frame 110 at the welding spot WS. The first and second hatching areas HA1 and HA2 have the higher surface roughness than another area of each of the first and second welding parts WP1 and WP2. When the surface roughness becomes large, an absorptance of a laser beam increases. Accordingly, when the first and second hatching areas HA1 and HA2 are irradiated with the welding laser, laser process efficiency increases according to the rough surfaces of the first and second hatching areas HA1 and HA2, and the welding characteristics may be improved.

In addition, when the laser is irradiated in order to increase the surface roughness of the first and second hatching areas HA1 and HA2, the size of the grains constituting the mask sheet 120 may be changed by heat in the first and second hatching areas HA1 and HA2. In other words, the grain size in the first and second hatching areas HA1 and HA2 may be larger than that in the pattern part PP. As an example of the inventive concept, the grain size in the first and second hatching areas HA' and HA2 may be several micrometers, and the grain size in the pattern part PP may be tens of nanometers. As the grain size increases, a fusion phenomenon at the welding spot may decrease in a welding process.

Figure 8A:
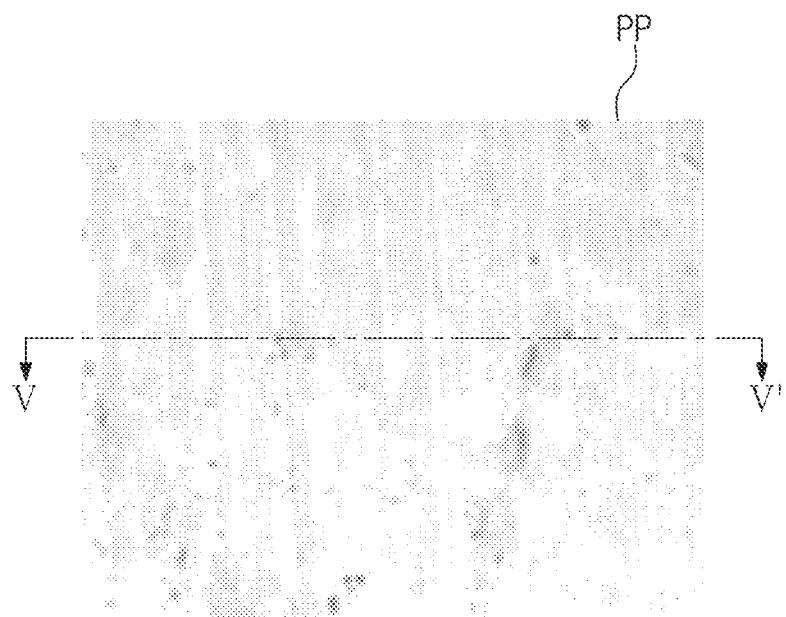
FIG. 8A is a plan view obtained by capturing an image of the surface of a pattern part illustrated in FIG. 4.
Figure 8B:
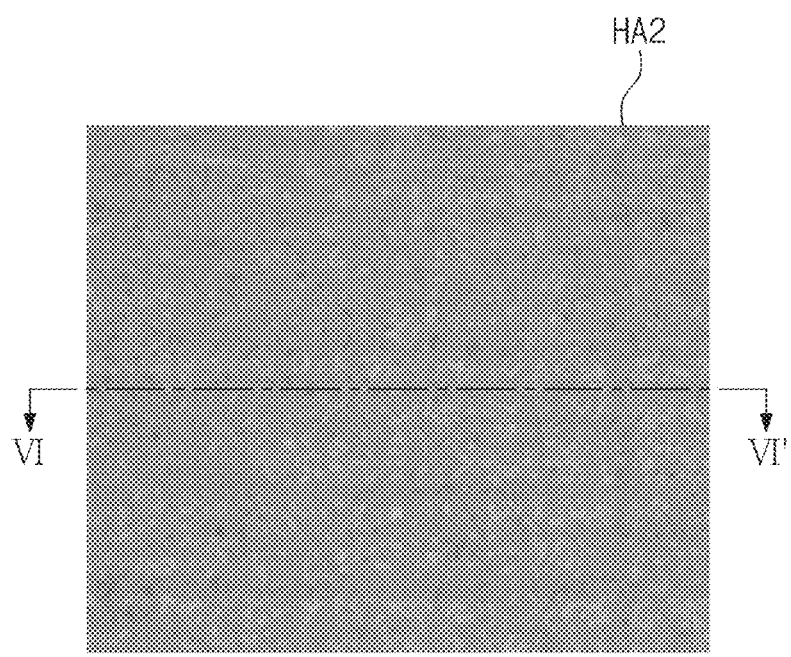
FIG. 8B is a plan view obtained by capturing an image of the surface of a second hatching area illustrated in FIG. 4.
Figure 9A:
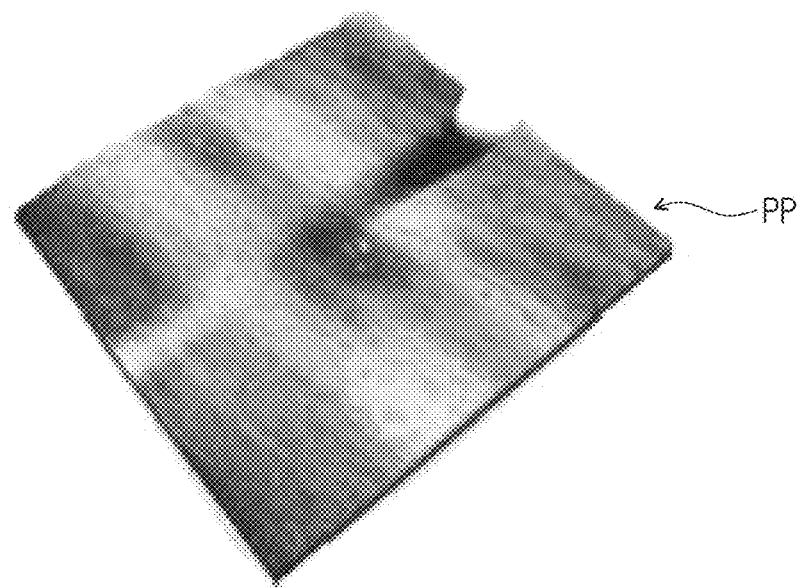
FIG. 9A is a stereoscopic view obtained by capturing an image of the surface of the pattern part illustrated in FIG. 4.
Figure 9B:
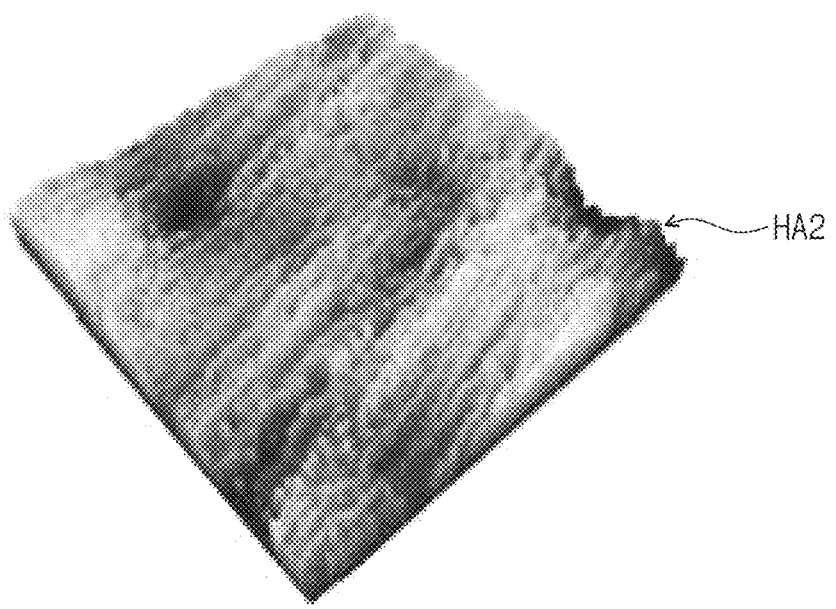
FIG. 9B is a stereoscopic view obtained by capturing an image of the surface of the second hatching area illustrated in FIG. 4.
Figure 10A:
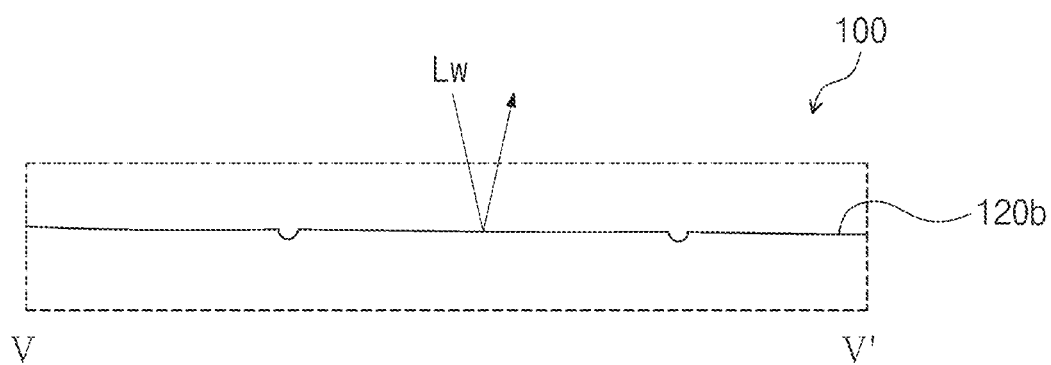
FIG. 10A is a cross-sectional view cut along a cutting line V-V' illustrated in FIG. 8A.
Figure 10B:
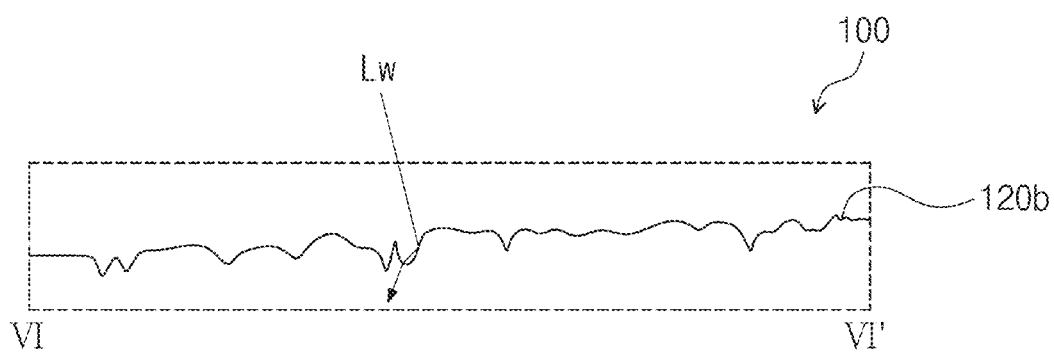
FIG. 10B is a cross-sectional view cut along line VI-VI' illustrated in FIG. 8B.

FIG. 8A is a plan view obtained by capturing an image of the surface of the pattern part illustrated in FIG. 4, and FIG. 8B is a plan view obtained by capturing an image of the surface of the second hatching area illustrated in FIG. 4. FIG. 9A is a stereoscopic view obtained by capturing an image of the surface of the pattern part illustrated in FIG. 4, and FIG. 9B is a stereoscopic view obtained by capturing an image of the surface of the second hatching area illustrated in FIG. 4. FIG. 10A is a cross-sectional view cut along a cutting line V-V' illustrated in FIG. 8A, and FIG. 10B is a cross-sectional view cut along line VI-VI' illustrated in FIG. 8B.

Referring to FIGS. 8A to 10B, the surface roughnesses of the second surfaces 120b in the first and second hatching areas HA1 and HA2 and in the pattern part PP are different. The surface roughness of the second surface 120b in the pattern part PP is smaller than that of the second surface 120b in the first and second hatching areas HA1 and HA2.

In particular, an arithmetical average roughness Ra of the second surfaces 120b in the first and second hatching areas HA1 and HA2 is different from that of the second surface 120b in the pattern part PP. The second surface 120b has a first arithmetical average surface roughness in the first and second hatching areas HA1 and HA2, and the second surface 120b has a second arithmetical average surface roughness in the pattern part PP. The first arithmetical average roughness is larger than the second arithmetical average roughness. As an example of the inventive concept, the first arithmetic average roughness may be about 0.1 μm to about 0.2 μm, and the second arithmetic average roughness may be about 0 μm to about 0.05 μm.

In addition, a ten-point average roughness Rz of the second surface 120b in the first and second hatching areas HA1 and HA2 is different from that of the second surface 120b in the pattern part PP. The second surface 120b in the first and second hatching areas HA1 and HA2 has a first ten-point average roughness, and the second surface 120b in the pattern part PP has a second ten-point average roughness. The first ten-point average roughness is larger than the second ten-point average roughness. As an example of the inventive concept, the first ten-point average roughness may be about 2.0 μm to about 5.0 μm, and the second ten-point average roughness may be about 0 μam to about 0.5 μm.

As an example of the inventive concept, each of the mask sheets 120 may have the thickness of about 20 μm to about 50 μm.

In relation to FIG. 10A, when the surface that is smooth like the second surface 120b provided in the pattern part PP is irradiated with a laser, the laser is reflected by the surface and thus a proportion of the laser which is not absorbed inside and then is reflected outside increases. In other words, an absorptance of the laser beam is low. However, as shown in FIG. 10B, when the first and second hatching areas HA1 and HA2 having the high surface roughness are irradiated with the welding laser, the laser is reflected everywhere by the rough surface of the first and second hatching areas HA1 and HA2, the proportion of the laser being reflected outside decreases, and a part of the beam reflected everywhere is absorbed inside. Accordingly, the overall absorptance of the laser beam increases.

As the absorptance of the laser beam increases, efficiency of the laser process in the welding procedure increases and a welding defect may be reduced.

Figure 11A:
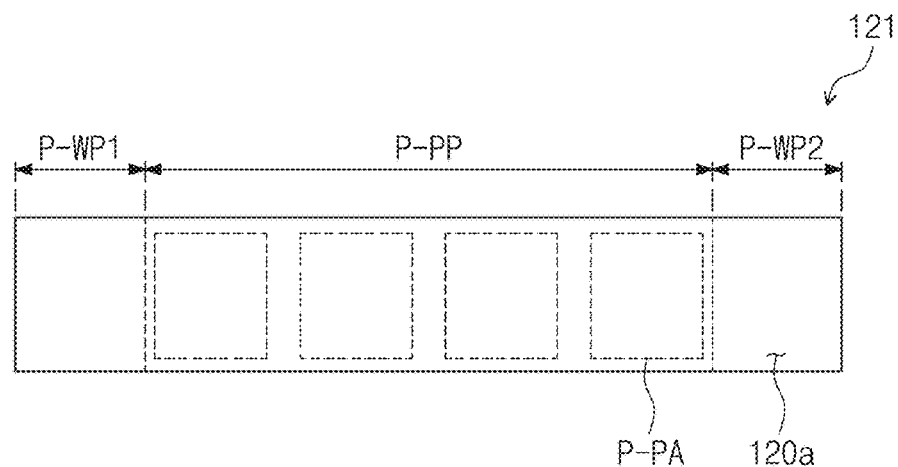
FIGS. 11A, 11B, 11C, 11D, 11E, 11F, and 11G are process charts showing a procedure for providing the mask assembly illustrated in FIG. 4.
Figure 11B:
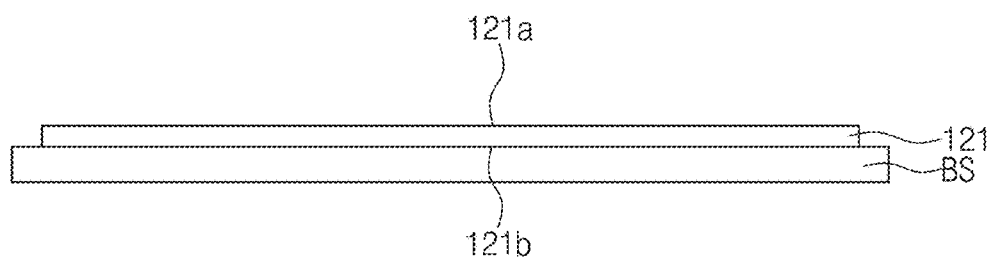
Figure 11C:
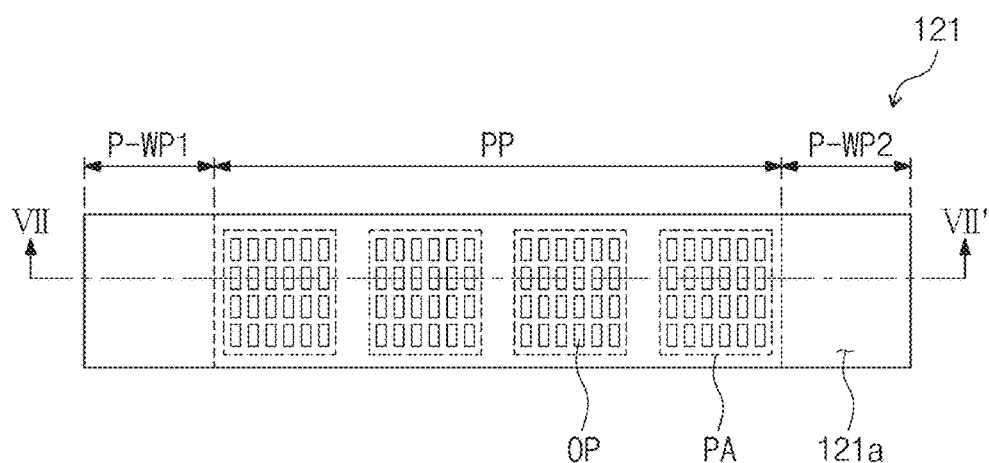
Figure 11D:
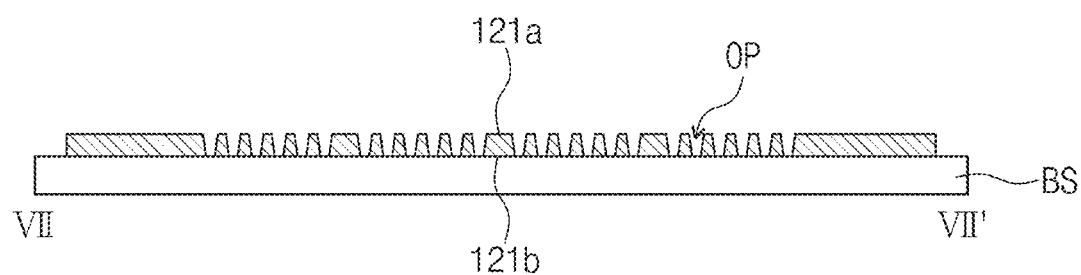
Figure 11E:
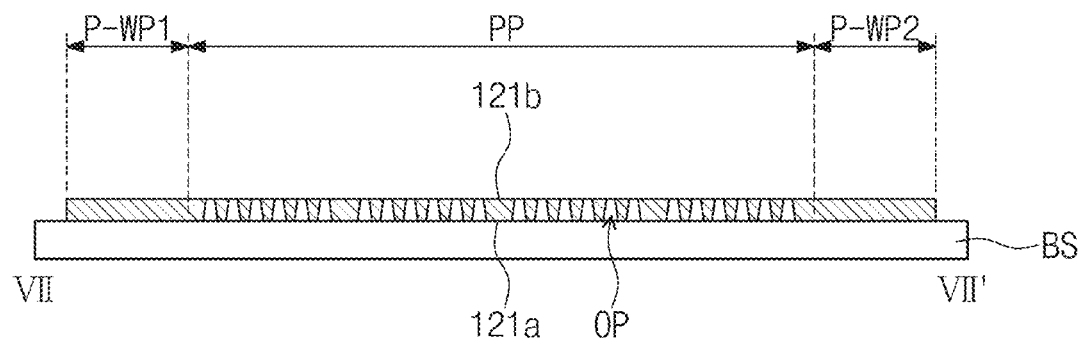
Figure 11F:
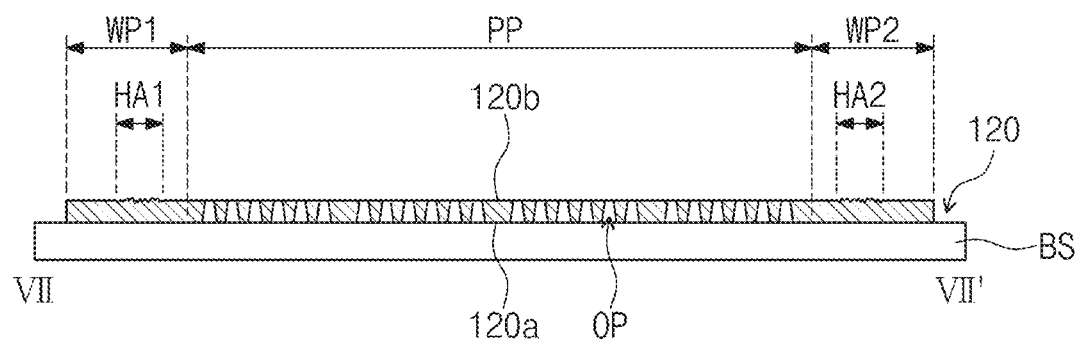
Figure 11G:
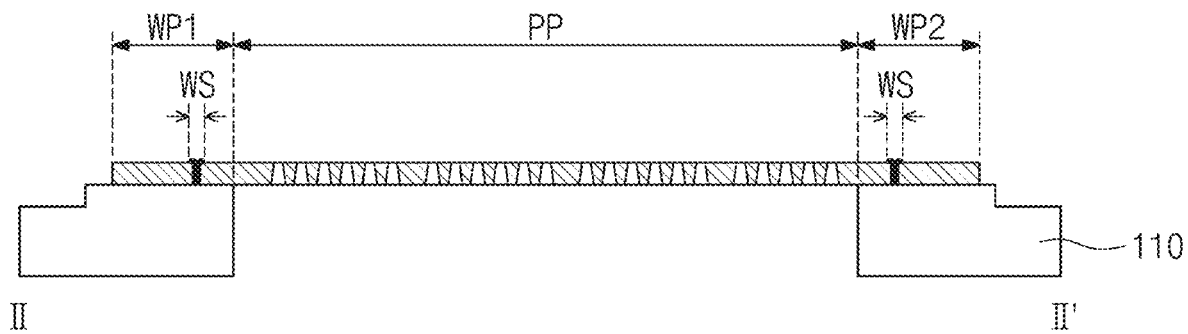
Figure 12:
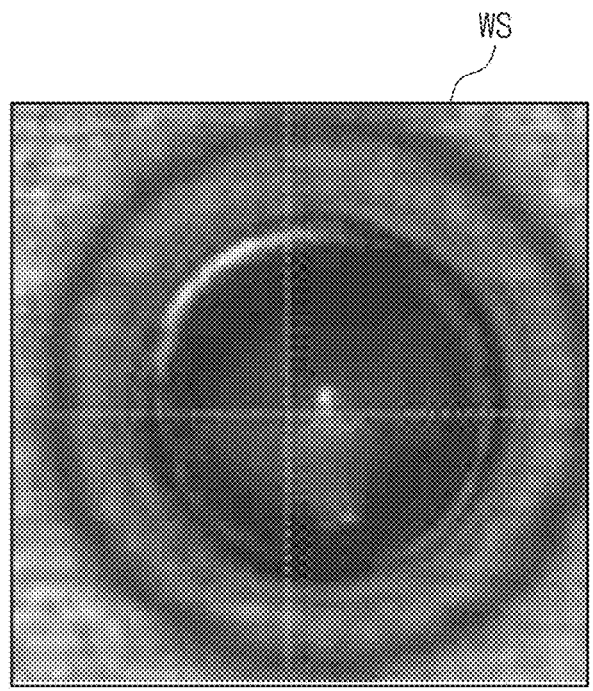
FIG. 12 is a plan view obtained by capturing an image of a welding spot of FIG. 11G.

FIGS. 11A to 11G are process charts showing a procedure for providing the mask assembly illustrated in FIG. 4, and FIG. 12 is a plan view obtained by capturing an image of a welding spot of FIG. 11G.

In relation to FIGS. 11A and 11B, a base sheet 121 to be manufactured as the mask sheet 120 (see FIG. 2) is provided. The base sheet 121 may be disposed on a base substrate BS for machining. Here, the base sheet 121 is provided with first and second surfaces 121a and 121b. The second surface 121b faces the base substrate BS and the first surface 121a is opposite to the second surface face 121b. The first surface 121a may be defined as an upper surface of the base sheet 121, and the second surface 121b may be defined as a lower surface of the base sheet 121.

The base sheet 121 may comprise a metal material of an iron-nickel alloy. The base sheet 121 may be provided in a rolling manner or an electroforming manner. In relation to FIGS. 11A to 11E, descriptions will be provided by exemplifying a metal base sheet manufactured in the electroforming manner.

In the base sheet 121, a provisional pattern part P-PP, and first and second provisional welding parts P-WP1 and P-WP2 disposed in both sides of the provisional pattern part P-PP may be defined. A plurality of provisional pattern areas P-PA may be defined in the provisional pattern part P-PP.

Processing is performed to provide a pattern in each of the provision pattern areas P-PA of the provisional pattern part P-PP.

As shown in FIGS. 11C and 11D, a plurality of processing patterns may be provided in the basis sheet 121. That is, after processing, a pattern part PP comprises a plurality of pattern area PA, a plurality of processing patterns is provided in each of the pattern areas PA, Here, each of the processing patterns may be opening parts OP.

As an example of the inventive concept, the process for providing the opening parts OP may include a process of irradiating with a laser, but is not limited thereto.

The process for providing the processing pattern may be performed by irradiating the laser over the first surface 121a of the base sheet 121.

When processing, as shown in FIG. 11E, the base sheet 121 is inverted and disposed on the base substrate BS. In other words, after being inverted, the first surface 121a of the base sheet 121 faces the base substrate BS. Here, the first surface 121a of the base sheet 121 may be defined as a lower surface of the base sheet 121, and the second surface 121b may be defined as an upper surface of the base sheet 121.

A hatching process may be performed for increasing the surface roughness of a part of the first and second welding parts WP1 and WP2 in the second surface 121b of the base sheet 121. The hatching process may be performed by irradiating the part of the first and second welding parts WP1 and WP2 with a hatching laser. As an example of the inventive concept, the hatching laser may have a green wavelength band.

The hatching process is not limited to the process for irradiating the hatching laser, but may include a process capable of increasing the surface roughness. In other words, as another embodiment of the inventive concept, the hatching process may include a polishing process, a sandblasting process, an electrochemical nano-etching process, or the like in order to increase the surface roughness of a part of the welding part.

When the hatching process is completed, as shown in FIG. 11F, a mask sheet 120, to which the first and second hatching areas HA1 and HA2 are provided respectively at the first and second welding parts WP1 and WP2, may be finished. The first and second hatching areas HA1 and HA2 may have the higher surface roughness than the pattern part PP. In addition, the first and second hatching areas HA1 and HA2 may have the higher surface roughness than other area of the first and second welding parts WP1 and WP2.

Then, referring to FIGS. 11F and 11G, the mask sheet 120 may be disposed on the mask frame 110. A plurality of mask sheets 120 may be disposed on the mask frame 110. Then, a welding process is performed for fixing the mask sheets 120 on the mask frame 110. As an example of the inventive concept, the welding process may be performed by irradiating a part of the first and second hatching areas HA1 and HA2 with the welding laser. When the welding laser is irradiated, the mask sheets 120 are fused in the area to which the welding laser is irradiated and the fused parts are cured and fixed to the mask frame 110.

Like the first and second hatching areas HA1 and HA2, when the welding laser is irradiated on a position at which the surface roughness is high, the welding laser may be reflected at various angles by the rough surfaces of the first and second hatching areas HA1 and HA2. Accordingly, a proportion of the laser reflected outside the mask sheet 120 is reduced, and a proportion of the laser absorbed inside increases. Accordingly, the overall absorptance of the laser beam increases. When the laser absorptance is reduced, heat is not transferred well and the mask sheet may be partially fused, which may result in a fault that the mask sheet is not fixed properly to the mask frame. However, when the laser absorptance is increased by the high surface roughness, the welding is normally performed as illustrated in FIG. 12, the welding characteristics may increase, and, as a result, a fraction defective may be reduced.

When the welding process is completed, the welding spots WS are provided in the first and second welding parts HA1 and HA2. The plurality of welding spots WS may be provided in each of the hatching areas HA1 and HA2. At the welding spot WS, the mask sheet 120 may be fixed to the mask frame 110.

Figure 13:
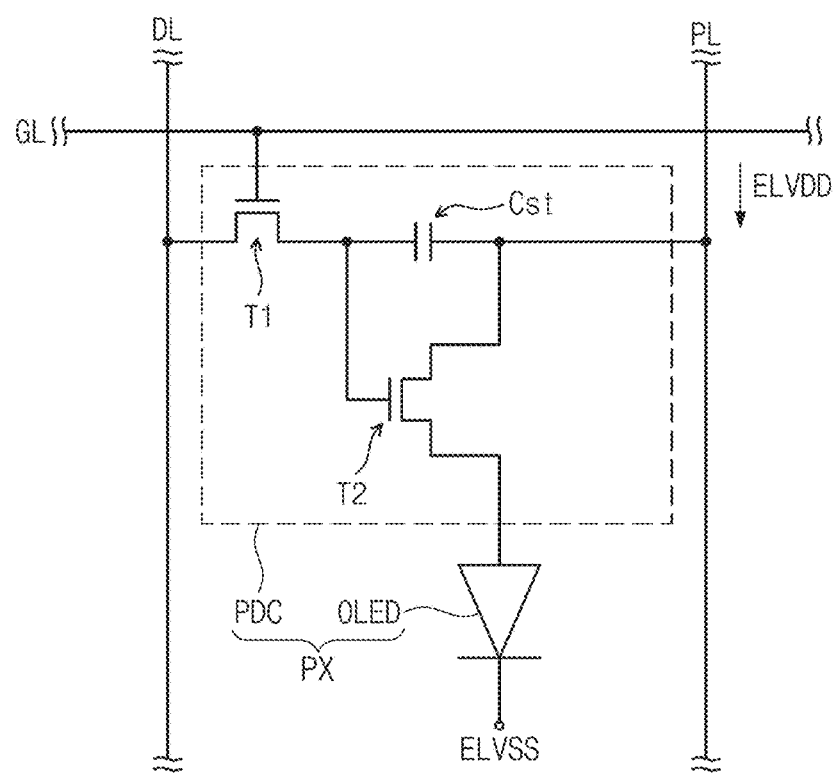
FIG. 13 is an equivalent circuit diagram of a pixel of an organic light emitting display apparatus according to an embodiment of the inventive concept.
Figure 14:
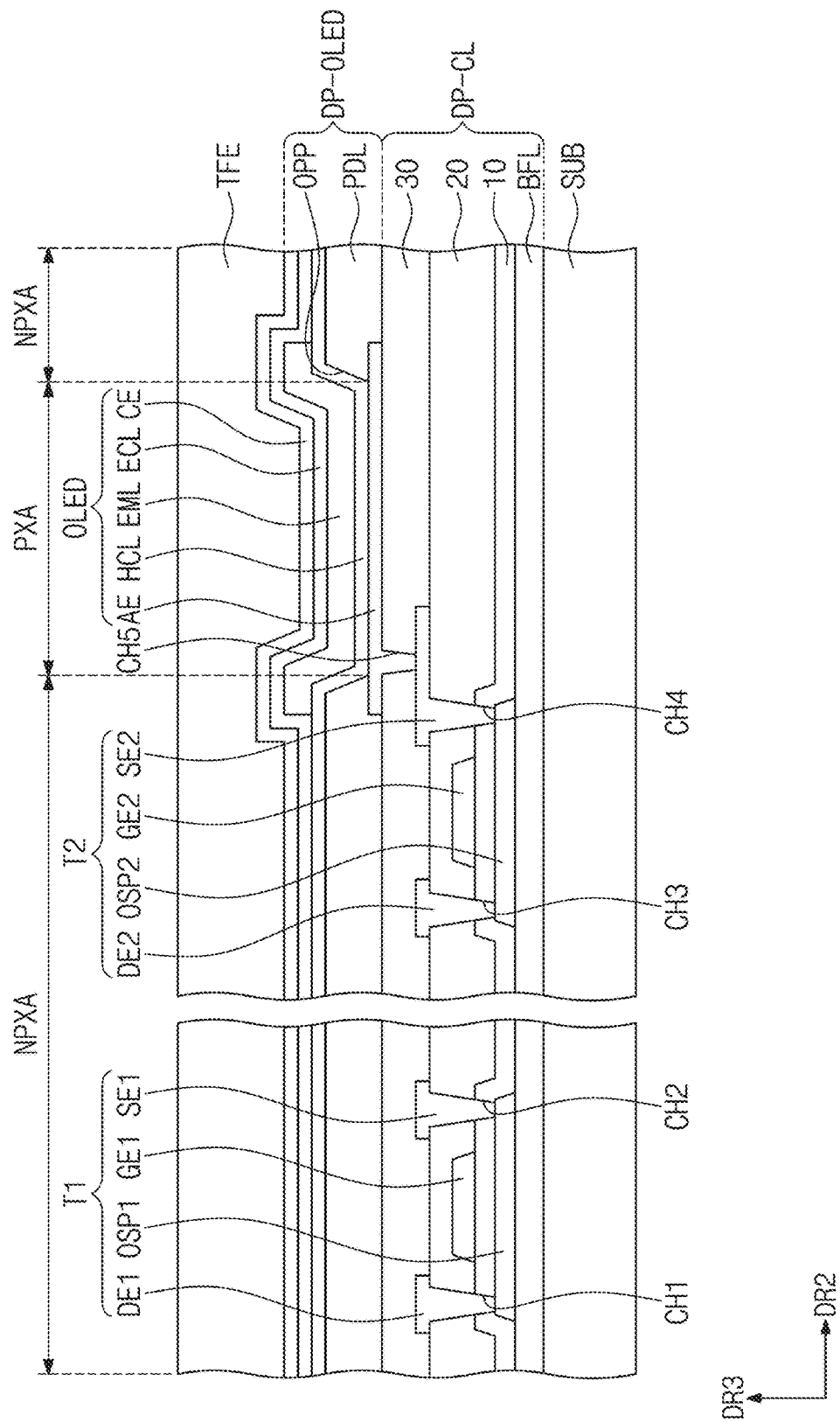
FIG. 14 is an enlarged cross-sectional view of the organic light emitting display apparatus according to an embodiment of the inventive concept.

FIG. 13 is an equivalent circuit diagram of a pixel of an organic light emitting display apparatus according to an embodiment of the inventive concept, and FIG. 14 is an enlarged cross-sectional view of the organic light emitting display apparatus according to an embodiment of the inventive concept.

As shown in FIGS. 13 and 14, the organic light emitting display apparatus may include a plurality of pixels PX. In FIG. 13, the pixel PX connected to any one gate line GL, any one data line DL, and the power supply line PL is exemplarily illustrated. The configuration of the pixel PX is not limited thereto, but may be modified and practiced.

The pixel PX according to the embodiment of the inventive concept may include an organic light emitting diode and a pixel driving circuit PDC. The organic light emitting diode OLED may be a front light emitting type diode or rear light emitting type diode. The pixel driving circuit PDC may be a circuit for driving an organic light emitting diode OLED. As an example of the inventive concept, the pixel driving circuit PDC may include a first transistor T1 (or a switching transistor), a second transistor T2 (or a driving transistor) and a capacitor Cst. A first power supply voltage ELVDD is provided to the second transistor T2, and a second power supply voltage ELVSS is provided to the organic light emitting diode OLED. The second power supply voltage ELCSS may be lower than the first power supply voltage ELVDD.

The first transistor T1 outputs a data signal applied to the data line in response to a scan signal applied to the scan line GL. The capacitor Cst is charged with a voltage corresponding to the data signal received from the first transistor T1.

The second transistor T2 is connected to the organic light emitting diode OLED. The second transistor T2 controls a driving current flowing through the organic light emitting diode OLED in correspondence to a charge amount stored in the capacitor Cst. The organic light emitting diode OLED emits light during a turn-on period of the second transistor T2.

FIG. 13 illustrates a structure in which the pixel driving circuit PDC is provided with two transistors T1 and T2 and one capacitor Cst, but the configuration of the pixel driving circuit PDC is not limited thereto.

FIG. 14 illustrates a partial cross section of the display apparatus corresponding to the equivalent circuit illustrated in FIG. 13.

A circuit element layer DP-CL, a display element layer DP-OLED, and a thin film encapsulation layer TFE are sequentially disposed on a base layer SUB.

The circuit element layer DP-CL includes at least one inorganic film, at least one organic film and a circuit element. The circuit element layer DP-CL may include a buffer layer BFL that is an inorganic layer, a first intermediate inorganic layer 10 and a second intermediate inorganic layer 20, and an intermediate organic layer 30 that is an organic layer.

The inorganic layers may include silicon nitride, silicon oxy-nitride and silicon oxide, etc. The organic layer may include at least one among an acrylic-based resin, a methacrylic-based resin, polyisoprene, a vinyl-based resin, an epoxy-based resin, a urethane-based resin, a cellulose-based resin, a siloxane-based resin, a polyimide-based resin, a polyamide-base resin and a perylene-based resin. The circuit element includes conductive patterns and/or semiconductor patterns.

The buffer layer BFL enhances a binding force between the base layer SUB and the conductive patterns or the semiconductor patterns. Although not illustrated separately, a barrier layer configured to prevent a foreign material from being flowed in may be further disposed on an upper surface of the base layer SUB. The buffer layer BFL and barrier layer may be selectively disposed/omitted.

A semiconductor pattern OSP1 (hereinafter, a first semiconductor pattern) of a first transistor T1 and a semiconductor pattern OSP2 (hereinafter, a second semiconductor pattern) of a second transistor TR2 are disposed on the buffer layer BFL. The first semiconductor pattern OSP1 and the second semiconductor pattern OSP2 may be selected from among amorphous silicon, polysilicon and metal oxide semiconductor.

The first intermediate inorganic layer 10 is disposed on the first semiconductor pattern OSP1 and second semiconductor pattern OSP2. A control electrode GE1 (hereinafter, a first control electrode) of the first transistor T1 and a control electrode GE2 (hereinafter, a second control electrode) of the second transistor TR2 are disposed on the first intermediate inorganic layer 10. The first control electrode GE1 and the second control electrode GE2 may be manufactured according to the same photolithography process as that of the gate lines GL (see FIG. 4).

The second intermediate inorganic layer 20 configured to cover the first control electrode GE1 and the second control electrode GE2 is disposed on the first intermediate inorganic layer 10. An input electrode DE1 (hereinafter, a first input electrode) and an output electrode SE1 (hereinafter, a first output electrode) of the first transistor T1, and an input electrode DE2 (hereinafter, a second input electrode) and an output electrode SE2 (hereinafter, a second output electrode) of the second transistor TR2 are disposed on the second intermediate inorganic layer 20.

The first input electrode DE1 and the first output electrode SE1 are connected to the first semiconductor pattern OSP1 through a first through-hole CH1 and a second through-hole CH2 configured to penetrate respectively through the first intermediate inorganic layer 10 and the second intermediate inorganic layer 20. The second input electrode DE2 and the second output electrode SE2 are connected to the second semiconductor pattern OSP2 through a third through-hole CH3 and a fourth through-hole CH4 configured to penetrate respectively through the first intermediate inorganic layer 10 and the second intermediate inorganic layer 20. In other words, in another embodiment of the inventive concept, a part of the first transistor T1 and the second transistor T2 may be modified to and practiced as a bottom-gate structure.

The intermediate organic layer 30 configured to cover the first input electrode DE1, the second input electrode DE2, the first output electrode SE1, and the second output electrode SE2 is disposed on the second intermediate inorganic layer 20. The intermediate organic layer 30 may provide a flat surface.

The display element layer DP-OLED is disposed on the intermediate organic layer 30. The display element layer DP-OLED may include a pixel definition layer PDL and the organic light emitting diode OLED. Like the intermediate organic layer 30, the pixel definition layer PDL may include an organic material. A first electrode AE is disposed on the intermediate layer 30. The first electrode AE is connected to the second output electrode SE2 through a fifth through-hole CH5 configured to penetrate through the intermediate organic layer 30. An opening part OPP is defined in the pixel definition layer PDL. The opening part OPP of the pixel definition layer PDL exposes at least a part of the first electrode AE.

The pixel PX may be disposed on a pixel area on a plane. The pixel area may include the emission area PXA and the non-emission area NPXA adjacent to the emission area PXA. The non-emission area NPXA may surround the emission area PXA. In the present embodiment, the pixel area PXA is defined to correspond to a part of area of the first electrode AE exposed by the opening part OPP.

The hole control layer HCL may be commonly disposed on the pixel PXA and the surrounding pixel area NPXA. Although not shown separately, a common layer such as the hole control layer HCL may be commonly formed in the plurality of pixels PX.

A light emission layer EML is disposed on the hole control layer HCL. The light emission layer EML may be disposed on an area corresponding to the opening part OPP. In other words, the light emission layer EML may be separately formed in each of the plurality of pixels PX. The light emission layer EML may include an organic material and/or an inorganic material. Here, as an example of the inventive concept, a structure in which the light emission layer EML is patterned in a pixel unit is illustrated. A process for patterning the light emission layer EML may be performed using the mask assembly 100 illustrated in FIGS. 1 to 11G.

An electron control layer ECL is disposed on the light emission layer EML. Although not illustrated separately, the electron control layer ECL may be commonly provided on the plurality of pixels PX (see FIG. 3).

The second electrode CE is disposed on the electron control layer ECL. The second electrode CE is commonly disposed in the plurality of pixels PX.

The thin film encapsulation layer TFE is disposed on the second electrode CE. The thin film encapsulation layer TFE is commonly disposed on the plurality of pixels PX. In the embodiment, the thin film encapsulation layer TFE directly covers the second electrode CE. In an embodiment of the inventive concept, a capping layer configured to cover the second electrode CE may be further disposed between the thin film encapsulation layer TFE and the second electrode CE. Here, the thin film encapsulation layer TFE may directly cover the capping layer.

According to embodiments of the inventive concept, a hatching area having a high surface roughness is provided to a welding part of a mask sheet. When the hatching area is irradiated with a welding laser, the welding laser may be reflected at various angles by the rough surface of the hatching area. Accordingly, an overall absorptance of the welding laser increases, and accordingly, welding characteristics between a mask sheet and a mask frame may be improved.

While this disclosure has been described with reference to exemplary embodiments thereof, it will be clear to those of ordinary skill in the art to which the invention pertains that various changes and modifications may be made to the described embodiments without departing from the spirit and technical area of the disclosure as defined in the appended claims and their equivalents.

Thus, the scope of the inventive concept shall not be restricted or limited by the foregoing description, but be determined by the broadest permissible interpretation of the following claims.

What is claimed is:

1. A mask assembly comprising:
a mask sheet comprising a pattern part with at least one opening part, and a welding part connected to the pattern part; and
a mask frame on which the mask sheet is mounted, the mask frame being welded to the welding part of the mask sheet,
wherein the mask sheet comprises a first surface facing the mask frame and a second surface opposite to the first surface,
wherein the welding part comprises a hatching area, and a surface roughness of the second surface in the hatching area is larger than that of the second surface in the pattern part,
wherein an arithmetical average roughness of the second surface in the hatching area is about 0.1 µm to about 0.2 µm, and
wherein an arithmetical average roughness of the second surface in the pattern part is about 0 µm to about 0.05 µm.

2. The mask assembly of claim 1, wherein
the welding part further comprises a welding spot fixed to the mask frame, and
the welding spot is provided in the hatching area.

3. The mask assembly of claim 2, wherein the welding spot has a smaller width than the hatching area.

4. The mask assembly of claim 1, wherein a particle size of the mask sheet in the hatching area is larger than that of the mask sheet in the pattern part.

5. A mask assembly comprising:
a mask sheet comprising a pattern part with at least one opening part, and a welding part connected to the pattern part; and
a mask frame on which the mask sheet is mounted, the mask frame being welded to the welding part of the mask sheet,
wherein the mask sheet comprises a first surface facing the mask frame and a second surface opposite to the first surface,
wherein the welding part comprises a hatching area, and a surface roughness of the second surface in the hatching area is larger than that of the second surface in the pattern part,
wherein a ten-point roughness of the second surface in the hatching area is larger than that of the second surface in the pattern part.

6. The mask assembly of claim 5, wherein
the ten-point average roughness of the second surface in the hatching area is about 2.0 μm to about 5.0 μm, and
the ten-point average roughness of the second surface in the pattern part is about 0 μm to about 0.5 μm.

7. The mask assembly of claim 5, wherein the mask sheet has a thickness of about 20 μm to about 50 μm.

8. A method of manufacturing a mask assembly, the method comprising:
providing a base sheet comprising a provisional pattern part and a provisional welding part;
providing a machining pattern to the provisional pattern part at a first surface of the base sheet;
inverting the base sheet;
performing a hatching process for providing a hatching area in the provisional welding part on a second surface of the base sheet opposite to the first surface to complete a mask sheet, the hatching area having a higher surface roughness than the provisional pattern part; and
performing a welding process for irradiating the hatching area with a welding laser to fix the mask sheet to a mask frame.

9. The method according to claim 8, wherein the performing of the hatching process is proceeded by irradiating the hatching area with a hatching laser.

10. The method according to claim 9, wherein the hatching laser has a green wavelength band.

11. The method according to claim 8, wherein, in the performing of the welding process, a welding spot is provided in the hatching area by the welding laser.

12. The method according to claim 11, wherein a width of the hatching area is equal to or larger than that of the welding spot.

13. The method according to claim 8, wherein an arithmetical average roughness of the second surface in the hatching area is larger than that of the second surface in the pattern part.

14. The method according to claim 13, wherein
the arithmetical average roughness of the second surface in the hatching area is about 0.1 μm to about 0.2 μm, and
the arithmetical average roughness of the second surface in the pattern part is about 0 μm to about 0.05 μm.

15. The method according to claim 8, wherein a ten-point average roughness of the second surface in the hatching area is larger than that of the second surface in the pattern part.

16. The method according to claim 15, wherein
the ten-point average roughness of the second surface in the hatching area is about 2.0 μm to about 5.0 μm, and
the ten-point average roughness of the second surface in the pattern part is about 0 μm to about 0.5 μm.

17. The method according to claim 8, wherein the mask sheet has a nickel content of about 30 wt % to about 50 wt %.

18. A method of manufacturing a light emitting display device, which comprises a pixel comprising a light emitting element and a pixel driving circuit configured to drive the light emitting element, the method comprising:
providing the pixel driving circuit on a base layer; and
providing the light emitting element on the pixel driving circuit,
wherein the providing of the light emitting element comprises:
providing a first electrode;
providing a light emission layer on the first electrode using a mask assembly; and
providing a second electrode configured to face the first electrode on the light emission layer, and
the mask assembly comprises:
a mask sheet comprising a pattern part with at least one opening part, and a welding part connected to the pattern part; and
a mask frame on which the mask sheet is mounted, the mask frame being welded to the welding part of the mask sheet,
wherein the mask sheet comprises a first surface facing the mask frame and a second surface opposite to the first surface,
wherein the welding part comprises a hatching area, and a surface roughness of the second surface in the hatching area is larger than that of the second surface in the pattern part,
wherein the arithmetical average roughness of the second surface in the hatching area is about 0.1 μm to about 0.2 μm, and
wherein the arithmetical average roughness of the second surface in the pattern part is about 0 μm to about 0.05 μm.

* * * * *